(12) United States Patent
Lin et al.

(10) Patent No.: US 10,410,969 B2
(45) Date of Patent: Sep. 10, 2019

(54) SEMICONDUCTOR PACKAGE ASSEMBLY

(71) Applicant: MEDIATEK INC., Hsin-Chu (TW)

(72) Inventors: Tzu-Hung Lin, Hsinchu (TW);
Chia-Cheng Chang, Hsinchu (TW);
I-Hsuan Peng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/891,481

(22) Filed: Feb. 8, 2018

(65) Prior Publication Data
US 2018/0233452 A1    Aug. 16, 2018

Related U.S. Application Data

(60) Provisional application No. 62/459,081, filed on Feb. 15, 2017.

(51) Int. Cl.
*H01L 23/31* (2006.01)
*H01L 23/538* (2006.01)
(Continued)

(52) U.S. Cl.
CPC ........ *H01L 23/5389* (2013.01); *H01L 21/486* (2013.01); *H01L 21/563* (2013.01); *H01L 23/3128* (2013.01); *H01L 23/3675* (2013.01); *H01L 23/49816* (2013.01); *H01L 23/5283* (2013.01); *H01L 23/5386* (2013.01);
(Continued)

(58) Field of Classification Search
CPC ............. H01L 23/5389; H01L 23/5283; H01L 23/3128; H01L 23/49816; H01L 23/5386; H01L 21/486; H01L 24/05; H01L 24/81; H01L 25/18; H01L 21/563; H01L 24/13; H01L 25/105; H01L 23/3675; H01L 2924/15311; H01L 2224/16225; H01L 23/481
See application file for complete search history.

(56) References Cited

U.S. PATENT DOCUMENTS

| | | |
|---|---|---|
| 2010/0052132 A1 | 3/2010 | Baek et al. |
| 2011/0127679 A1* | 6/2011 | Eun ........................ H01L 23/481 257/774 |
| 2012/0112361 A1 | 5/2012 | Han et al. |
| 2012/0146207 A1 | 6/2012 | Chou et al. |

(Continued)

FOREIGN PATENT DOCUMENTS

WO    2012/012338 A1    1/2012

*Primary Examiner* — Ahmed N Sefer
(74) *Attorney, Agent, or Firm* — McClure, Qualey & Rodack, LLP

(57) ABSTRACT

The invention provides a semiconductor package assembly. The semiconductor package assembly includes a first semiconductor package and a second semiconductor package overlying a portion of the first semiconductor package. The first semiconductor package includes a first redistribution layer (RDL) structure, a first semiconductor die and a molding compound. The first semiconductor die is disposed on a first surface of the first RDL structure and electrically coupled to the first RDL structure. The molding compound is positioned overlying the first semiconductor die and the first surface of the first RDL structure. The second semiconductor package includes a first memory die and a second memory die vertically stacked on the first memory die. The second memory die is electrically coupled to first memory die by through silicon via (TSV) interconnects formed passing through the second memory die.

26 Claims, 9 Drawing Sheets

(51) Int. Cl.
*H01L 23/528* (2006.01)
*H01L 23/498* (2006.01)
*H01L 21/48* (2006.01)
*H01L 23/00* (2006.01)
*H01L 25/18* (2006.01)
*H01L 21/56* (2006.01)
*H01L 23/367* (2006.01)
*H01L 25/10* (2006.01)

(52) U.S. Cl.
CPC ............. *H01L 24/05* (2013.01); *H01L 24/13* (2013.01); *H01L 24/81* (2013.01); *H01L 25/105* (2013.01); *H01L 25/18* (2013.01); *H01L 2224/16225* (2013.01); *H01L 2924/15311* (2013.01)

(56) References Cited

U.S. PATENT DOCUMENTS

| | | | |
|---|---|---|---|
| 2013/0270682 A1 | 10/2013 | Hu et al. | |
| 2014/0159231 A1* | 6/2014 | Lundberg | B82Y 10/00 257/737 |
| 2014/0252632 A1* | 9/2014 | Barth | H01L 23/5384 257/773 |
| 2015/0048500 A1* | 2/2015 | Yu | H01L 25/50 257/737 |
| 2015/0279828 A1* | 10/2015 | Koopmans | H01L 25/18 257/713 |
| 2016/0079220 A1* | 3/2016 | Lin | H01L 25/0652 361/783 |
| 2016/0099231 A1* | 4/2016 | Yang | H01L 23/3171 257/693 |

\* cited by examiner

SEMICONDUCTOR PACKAGE ASSEMBLY

CROSS REFERENCE TO RELATED APPLICATIONS

This application claims the benefit of U.S. Provisional Application No. 62/459,081 filed on Feb. 15, 2017, the entirety of which is incorporated by reference herein.

BACKGROUND OF THE INVENTION

Field of the Invention

The present invention relates to a semiconductor package assembly, and in particular to a semiconductor package assembly including a fan-out wafer-level semiconductor package (FOWLP) with a high bandwidth memory (HBM) package.

Description of the Related Art

Package-on-package (PoP) package assembly is an integrated circuit packaging method that combines vertically discrete system-on-chips (SOC) and memory packages. Two or more packages are installed atop each other, i.e. stacked, with a standard interface to route signals between them. This allows higher component density in devices, such as mobile phones, personal digital assistants (PDAs), and digital cameras.

For memory applications with increased levels of integration as well as improved performance, bandwidth, latency, power, weight, and form factor, the signal pad to ground pad ratio becomes important in improving the coupling effect.

Thus, a novel semiconductor package assembly is desirable.

BRIEF SUMMARY OF THE INVENTION

Exemplary embodiments of a semiconductor package assembly are provided. An exemplary embodiment of a semiconductor package assembly includes a first semiconductor package and a second semiconductor package overlying a portion of the first semiconductor package. The first semiconductor package includes a first redistribution layer (RDL) structure, a first semiconductor die, and a molding compound. The first redistribution layer (RDL) structure has a first surface and a second surface opposite to the first surface. The first semiconductor die is disposed on the first surface of the first RDL structure and electrically coupled to the first RDL structure. The molding compound is positioned overlying the first semiconductor die and the first surface of the first RDL structure. The second semiconductor package includes a first memory die and a second memory die vertically stacked on the first memory die. The second memory die is electrically coupled to first memory die by through silicon via (TSV) interconnects formed passing through the second memory die.

Another exemplary embodiment of a semiconductor package assembly includes a first semiconductor package and a second semiconductor package stacked on the first semiconductor package. The first semiconductor package includes a first redistribution layer (RDL) structure, a logic die and a molding compound. The first redistribution layer (RDL) structure has a first surface and a second surface opposite to the first surface. The logic die is electrically coupled to the first RDL structure. The molding compound is positioned overlying the logic die and the first surface of the first RDL structure. The second semiconductor package includes a plurality of memory dies stacked one on top of the other. Each of the plurality of memory dies has through silicon via (TSV) interconnects. A boundary of the second semiconductor package is surrounded by a boundary of the molding compound of the first semiconductor package from a plan view.

An exemplary embodiment of a semiconductor package assembly includes a system-on-chip (SOC) package and a memory package stacked on the SOC package. The SOC package includes a first redistribution layer (RDL) structure, a logic die and a molding compound. The logic die is electrically coupled to the first RDL structure. The molding compound is positioned overlying the logic die and the first RDL structure. The memory package includes a plurality of memory dies stacked one on top of the other. Each of the plurality of memory dies has through silicon via (TSV) interconnects rather than RDL structures. The memory package is positioned overlying a portion of the molding compound of the SOC package.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
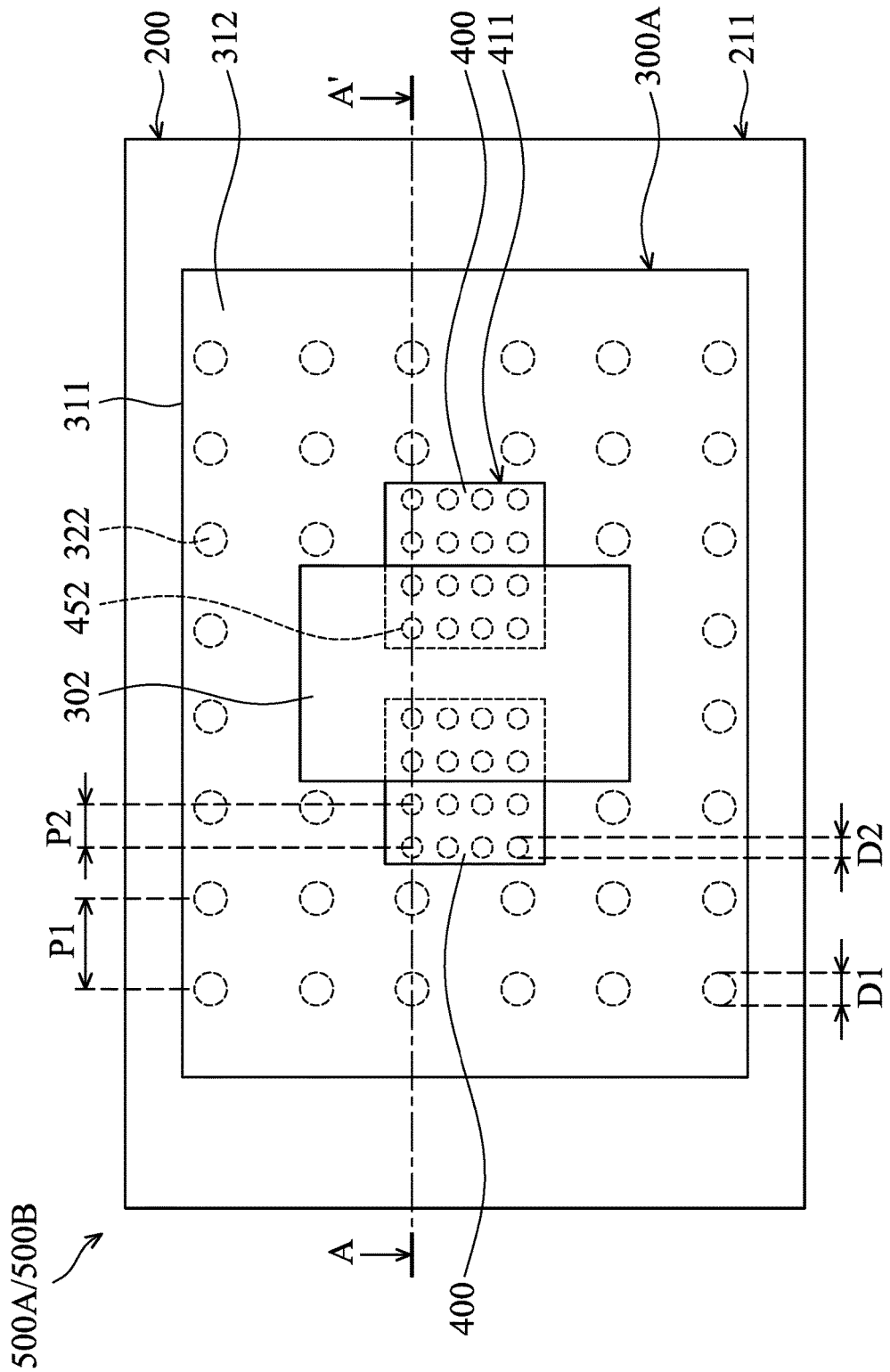
FIG. 1A is a plan view of a semiconductor package assembly including a system-on-chip (SOC) package and high bandwidth memory (HBM) packages stacked thereon in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1B:
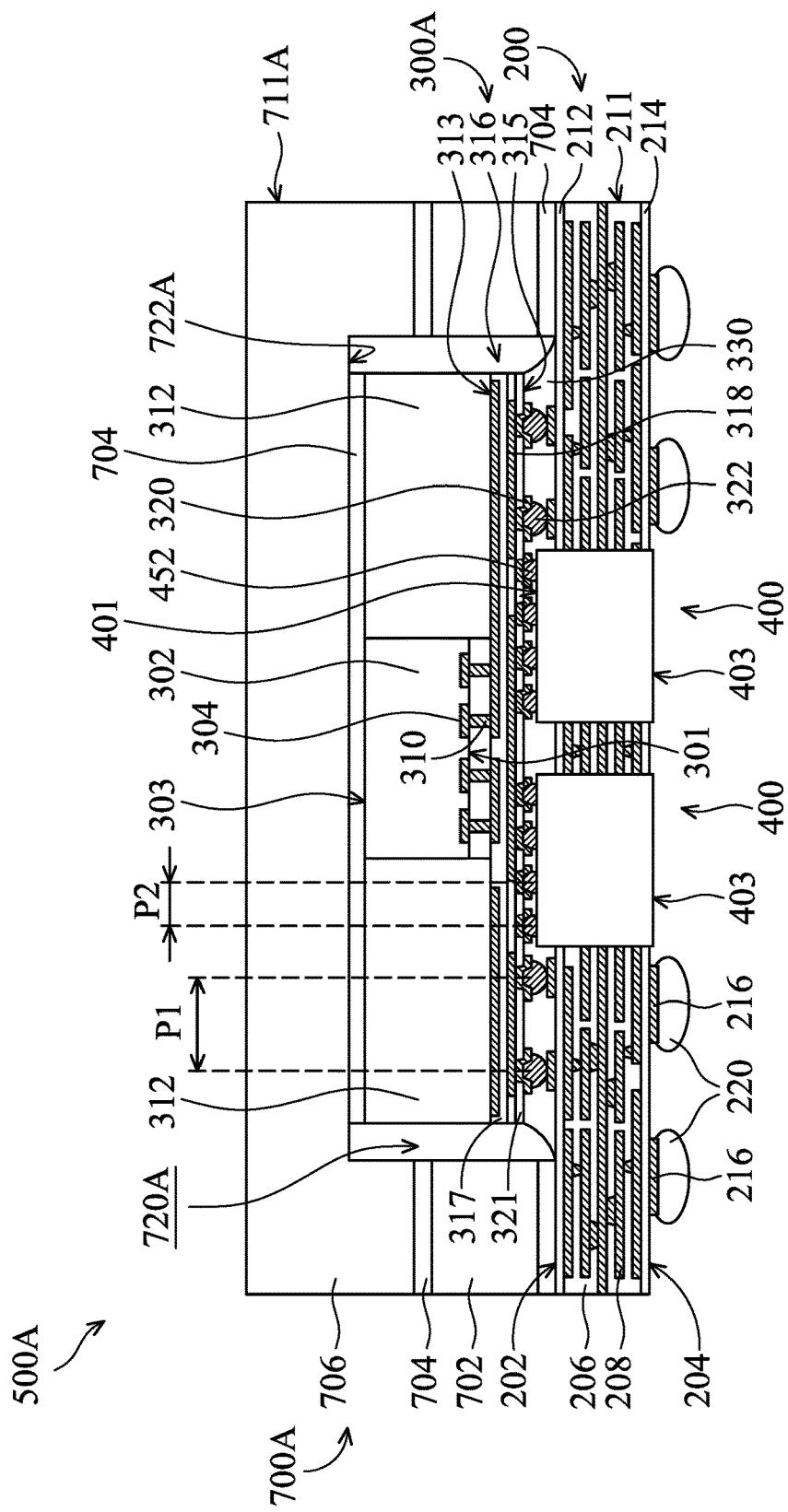
FIGS. 1B and 1C are cross-sectional views taken along line A-A' of FIG. 1A showing semiconductor package assemblies in accordance with some embodiments of the disclosure.

FIG. 1A is a plan view of a semiconductor package assembly 500A (or 500B) including a system-on-chip (SOC)

package and at least a high bandwidth memory (HBM) package (e.g. a high bandwidth dynamic random access memory (DRAM) package) stacked thereon in accordance with some embodiments of the disclosure. FIG. 1A also shows the arrangements of the SOC package, the HBM package and a base. In FIG. 1A, a heat sink structure is omitted. FIG. 1B is a cross-sectional view taken along line A-A' of FIG. 1A showing the semiconductor package assembly 500A in accordance with some embodiments of the disclosure. FIG. 1D is an enlarge view of a high bandwidth memory (HBM) package of the semiconductor package assembly 500A (or 500B) shown in FIG. 1B (or FIG. 1C).

In some embodiments, the semiconductor package assembly 500A (or 500B) is a package-on-package (POP) semiconductor package assembly. The semiconductor package assembly 500A includes at least two vertically stacked wafer-level semiconductor packages mounted on a base 200. For example, the vertically stacked wafer-level semiconductor packages may include a system-on-chip (SOC) package 300A and two high bandwidth memory (HBM) package 400 vertically stacked thereon, as shown in FIGS. 1A and 1B. It should be noted that the number of the HBM packages 400 integrated in the semiconductor package assembly 500A is not limited to the disclosed embodiment.

As shown in FIGS. 1A and 1B, the base 200 may include a package substrate, for example, a printed circuit board (PCB). In some embodiments, the base 200 has a package-attach surface 202 and a bump-attach surface 204 opposite to the package-attach surface 202. For example, the base 200 can be a single layer or a multilayer structure. The base 200 may include conductive traces 208, insulation layers 206, pads 210 and 216, solder mask layers 212 and 214 and conductive structures 220. In some embodiments, the conductive traces 208 are disposed in one or more insulation layers 206. The conductive traces 208 may include signal trace segments or ground trace segments, which are used for the input/output (I/O) connections of the SOC package 300A and the HBM packages 400. The conductive traces 208 may be electrically connected to corresponding pads 210 and 216. The pads 210 may be positioned close to the package-attach surface 202 and the pads 216 may be positioned close to bump-attach surface 204. In addition, the pads 210 may be exposed to openings of the solder mask layer 212, and the pads 216 may be exposed to openings of the solder mask layer 214. The pads 210 may be used for the SOC package 300A mounted directly thereon. The pads 216 may be used for the conductive structures 220 (e.g. solder balls) formed directly thereon.

As shown in FIGS. 1A and 1B, the SOC package 300A is mounted on the package-attach surface 202 of the base 200 by a bonding process. The SOC package 300A is mounted on the base 200 through the conductive structures 322. In some embodiments, the system-on-chip (SOC) package 300A is a semiconductor package including a logic die 302, a redistribution layer (RDL) structure 316 and a molding compound 312. For example, the SOC package 300A may include or may not include DRAM dies integrated therein. The logic die 302 may include a central processing unit (CPU), a graphic processing unit (GPU), a dynamic random access memory (DRAM) controller or any combination thereof.

As shown in FIGS. 1A and 1B, the logic die 302 has a front surface 301 and a back surface 303 opposite to the front surface 301. The logic die 302 may be fabricated by a flip-chip technology. The back surface 303 of the logic die 302 is close to or aligned with the top surface of the SOC package 300A. Pads 304 of the logic die 302 are disposed on the front surface 301 to be electrically connected to the circuitry (not shown) of the logic die 302. In some embodiments, the pads 304 belong to the uppermost metal layer of the interconnection structure (not shown) of the logic die 302. The pads 304 of the logic die 302 are in contact with the corresponding vias 310. The pads 304 of the logic die 302 of the SOC package 300A may face toward the base 200. It should be noted that the number of logic dies 302 of the SOC package 300A is not limited to the disclosed embodiment.

In some embodiments, as shown in FIGS. 1A and 1B, the RDL structure 316 of the SOC package 300A has a die-attach surface 313 and a bump-attach surface 315 opposite to the die-attach surface 313. The logic die 302 of the SOC package 300A is disposed on the die-attach surface 313 of the RDL structure 316. The pads 304 of the logic die 302 are electrically coupled to the RDL structure 316 through vias 310, which are positioned between the front surface of the logic die 302 and the die-attach surface 313 of the RDL structure 316. The RDL structure 316 may be in contact with and the vias 310. In some embodiments, the RDL structure 316 includes conductive traces 318, intermetal dielectric (IMD) layers 317, solder mask layer 321 and RDL contact pads 320. For example, the conductive traces 318 may be disposed in the corresponding IMD layers 317. The conductive traces 318 are electrically connected to corresponding RDL contact pads 320 close to the bump-attach surface 315. In addition, the RDL contact pads 320 may be formed filling openings of the solder mask layer 321.

As shown in FIGS. 1A and 1B, the conductive traces 318 may be designed to be fan out from one or more of the pads 304 of the logic die 302 to provide electrical connections between the logic die 302 and the RDL contact pads 320. Therefore, the RDL contact pads 320 may have a larger bond pitch than the pads 304 of the logic die 302, and may be suitable for a ball grid array or another package mounting system.

However, it should be noted that the number of conductive traces 318, the number of IMD layers 317 and the number of RDL contact pads 320 shown in FIGS. 1A and 1B is only an example and is not a limitation to the present invention.

In some embodiments, as shown in FIGS. 1A and 1B, the molding compound 312 of the SOC package 300A is positioned overlying RDL structure 316 and the logic die 302. The molding compound 312 is in contact with the top surface 303 the logic die 302 and the die-attach surface 313 of the RDL structure 316. In some embodiments, the molded compound 312 may be formed of a nonconductive material, such as an epoxy, a resin, a moldable polymer, or the like. The molding compound 312 may be applied while substantially liquid, and then may be cured through a chemical reaction, such as in an epoxy or resin. In some other embodiments, the molding compound 312 may be an ultraviolet (UV) or thermally cured polymer applied as a gel or malleable solid capable of being disposed around the logic die 302, and then may be cured through a UV or thermally curing process. The molding compound 312 may be cured with a mold (not shown).

In some embodiments, as shown in FIGS. 1A and 1B, the conductive structures 322 of the SOC package 300A are positioned between the bump-attach surface 315 of the RDL structure 316 and the package-attached surface 202 of the base 200. In addition, the conductive structures 322 electrically coupled to the RDL contact pads 320 of the RDL structure 316 and the pads of the base 200. The conductive structures 322 are coupled to the conductive traces 318 through the RDL contact pads 320. In some embodiments, the conductive structures 322 may comprise a conductive bump structure such as a copper bump or a solder bump structure, a conductive pillar structure, a conductive wire structure, or a conductive paste structure.

In some embodiments, as shown in FIGS. 1A and 1B, the HBM packages 400 of the semiconductor package assembly 500A are separated from each other and are vertically stacked on the SOC package 300A by a bonding process. In some embodiments, each of the HBM packages 400 is a high bandwidth DRAM package following the pin assignment rule (such as JEDEC Wide I/O Memory specification). Each of the HBM packages 400 is positioned overlying a portion of the SOC package 300A (or overlaying a portion of the logic die 302). Therefore, a boundary 411 of each of the HBM packages 400 is surrounded by a boundary 311 of the molding compound 312 of the SOC package 300A from a plan view shown in FIG. 1A. Each of the HBM packages 400 is positioned between the bump-attach surface 315 of the RDL structure 316 and the base 200, as shown in FIG. 1B. In addition, each of the HBM packages 400 is positioned overlying a portion of the bump-attach surface 315 of the RDL structure 316 of the first semiconductor package assembly 500A and separated from the logic die 302 through the RDL structure 316. In some embodiments, each of the HBM packages 400 is positioned next to the conductive structures 322 and electrically coupled to the RDL structure 316 of the SOC package 300A. Each of the HBM packages 400 is embedded in the base 200 and surrounded by the first conductive structures 322 of the SOC package 300A. In addition, each of the HBM packages 400 is surrounded by the base 200.

In some embodiments, the back surface 403 of each of the HBM packages 400 may be level with the bump-attached surface 204 of the base 200 (FIG. 1A). In some embodiments, the back surface 403 of each of the HBM packages 400 may be positioned between the package-attached surface 202 and the bump-attached surface 204 of the base 200. In some embodiments, the back surface 403 of each of the HBM packages 400 may be positioned beyond the bump-attached surface 204 of the base 200.

In some embodiments, as shown in FIGS. 1A, 1B and 1D, each of the HBM packages 400 includes a plurality of memory dies 600 stacked one on top of the other. The memory dies 600 of each of the HBM packages 400 may be fabricated by a flip-chip technology. Each of the plurality of HBM packages 400 may have a front surface 401 and a back surface 403 opposite to the front surface 401. In addition, each of the plurality of memory dies 600 may include through silicon via (TSV) interconnects 602 and conductive structures 604. The TSV interconnects 602 may be positioned passing through the corresponding memory die 600. The conductive structures 604 may be positioned on the front surface of the corresponding memory die 600. For example, one of the memory dies 600 may be positioned stacking on a back surface 403 of another memory die 600 and electrically connected to another memory die 600 through the TSV interconnects 602 and the conductive structures 604 of the one of the memory dies 600. In some embodiments, each of the HBM packages 400 includes the TSV interconnects 602 rather than RDL structures. In addition, each of the HBM packages 400 may further include a controller die 610 electrically coupled to the conductive structures 452. The memory dies 600 may stack on the controller die 610 and electrically coupled to the controller die 610. For example, the controller die 610 of each of the HBM packages 400 may be configured to control the corresponding memory dies 600. It should be noted that the number of memory dies 600 is not limited to the disclosed embodiment.

In some embodiments, as shown in FIGS. 1A and 1B, each of the HBM packages 400 includes conductive structures 452 in contact with the bump-attach surface 315 of the RDL structure 316 and electrically coupled to the RDL structure 316. For example, each of the conductive structures 322 of the SOC package 300A has a first diameter D1, and each of the conductive structures 452 of the HBM packages 400 has a second diameter D2 that is less than the first diameter D1. In addition, the diameter of the conductive structures 452 of each of the HBM packages 400 may be less than the diameter D1 and the second diameter D2. Therefore, the conductive structures 452 may also serve as microbumps.

In some embodiments, as shown in FIGS. 1A and 1B, the conductive structures 322 of the SOC package 300A are periodically arranged with a first pitch P1, and the conductive structures 452 of each of the HBM packages 400 are arranged with a second pitch P2 that is less than the first pitch P1. In addition, the conductive structures 452 of each of the HBM packages 400 may be arranged with a pitch that is less than the first pitch P1 and the second pitch P2.

In some embodiments, as shown in FIG. 1B, an underfill material or underfill 330 may be introduced into the gap between the SOC package 300A, the HBM packages 400 and the base 200 by a reflowing process. The underfill 330 may be configured to compensate for differing coefficients of thermal expansion (CTE) between the base 200, the SOC package 300A and the HBM packages 400. In some embodiments, the conductive structures 322 of the SOC package 300A and the conductive structures 452 of each of the HBM packages 400 are wrapped by the underfill material 330. In some embodiments, the underfill 330 may be capillary underfill (CUF), molded underfill (MUF) or a combination thereof.

In some embodiments, as shown in FIG. 1B, the SOC package 300A further includes a heat sink structure 700A overlying the SOC package 300A and the HBM packages 400. The heat sink structure 700A may be connected to the package-attached surface 202 of the base 200 by a thermal interface material 704 (or thermal paste) to form a space 720A for accommodating the SOC package 300A and the HBM packages 400. For example, the heat sink structure 700A may be connected to the back surface 303 of the SOC package 300A through the thermal interface material 704. In addition, a boundary 711A of the heat sink structure 700A may be aligned with a boundary 211 of the base 200, as shown in FIG. 1B.

In some embodiments, as shown in FIG. 1B, the heat sink structure 700A includes a ring portion 702 over the base 200 and a cover portion 706 over the ring portion 702. For example, the ring portion 702 of the heat sink structure 700A may be connected a portion of the package-attached surface 202 of the base 200 that is not covered by the SOC package 300A and the HBM packages 400. The ring portion 702 of the heat sink structure 700A may surround the SOC package 300A and the HBM packages 400. In addition, the cover portion 706 of the heat sink structure 700A may cover the SOC package 300A and the HBM packages 400. The cover portion 706 of the heat sink structure 700A may be connected to the ring portion 702 through the thermal interface material 704. The inner surface 722A of the cover portion 706 of the heat sink structure 700A may be connected to the SOC package 300A through the thermal interface material 704. Therefore, heat generated by the SOC package 300A and the HBM packages 400 may dissipate to the heat sink structure 700A more easily.

In some embodiments, the ring portion 702 and the cover portion 706 of the heat sink structure 700A is formed of metal materials, such as copper, stainless steel or other suitable metal materials. In some embodiments, the thermal interface material 704 consists of a matrix material and large volume fractions of electrically insulating, but thermally conductive filler. For example, the matrix material may include epoxies, silicones, urethanes, and acrylates or other suitable matrix materials. In addition, adhesive tapes are also available used as the matrix material. For example, the fillers may include aluminum oxide, boron nitride, zinc oxide, or a combination thereof.

Figure 1C:
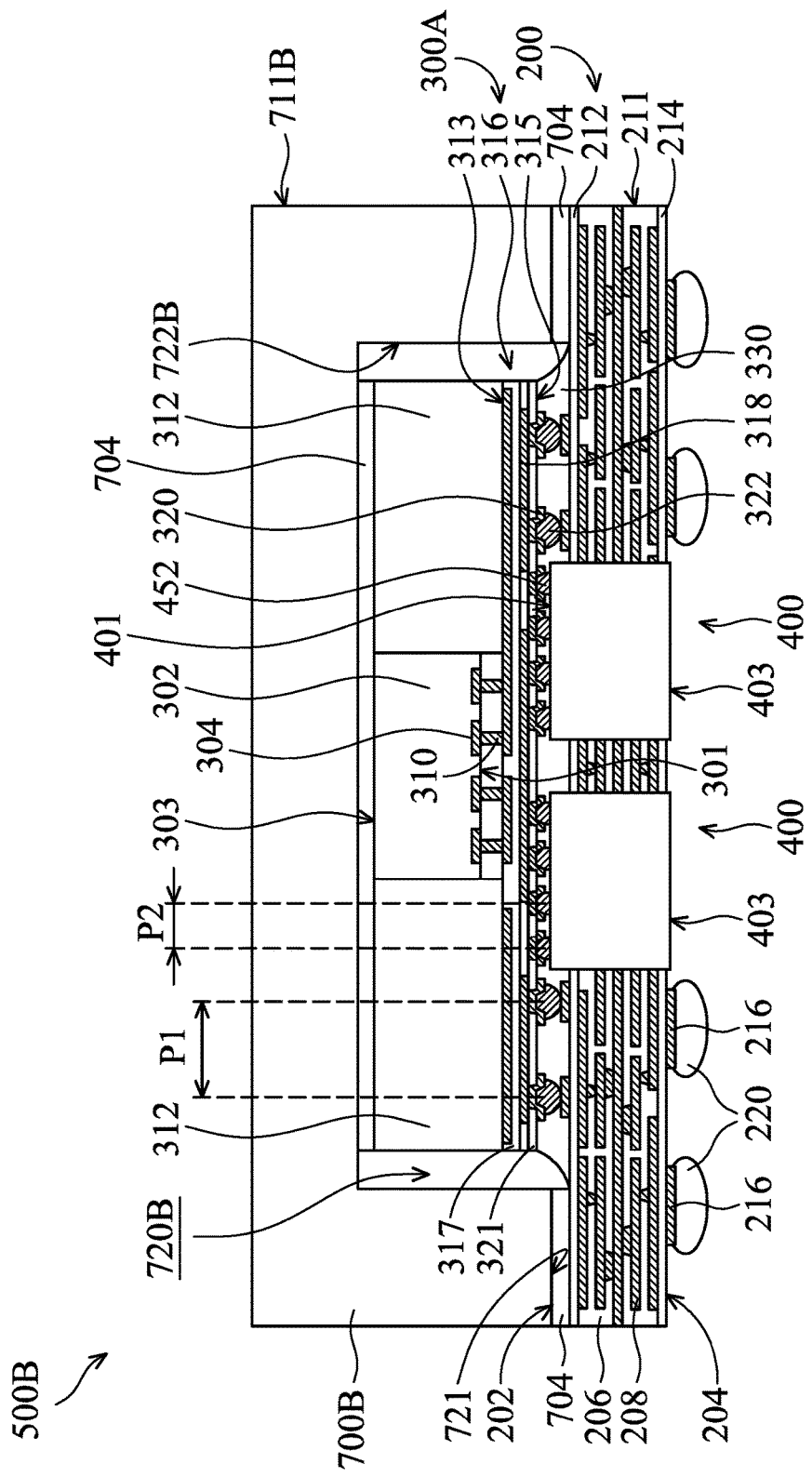
Figure 1D:
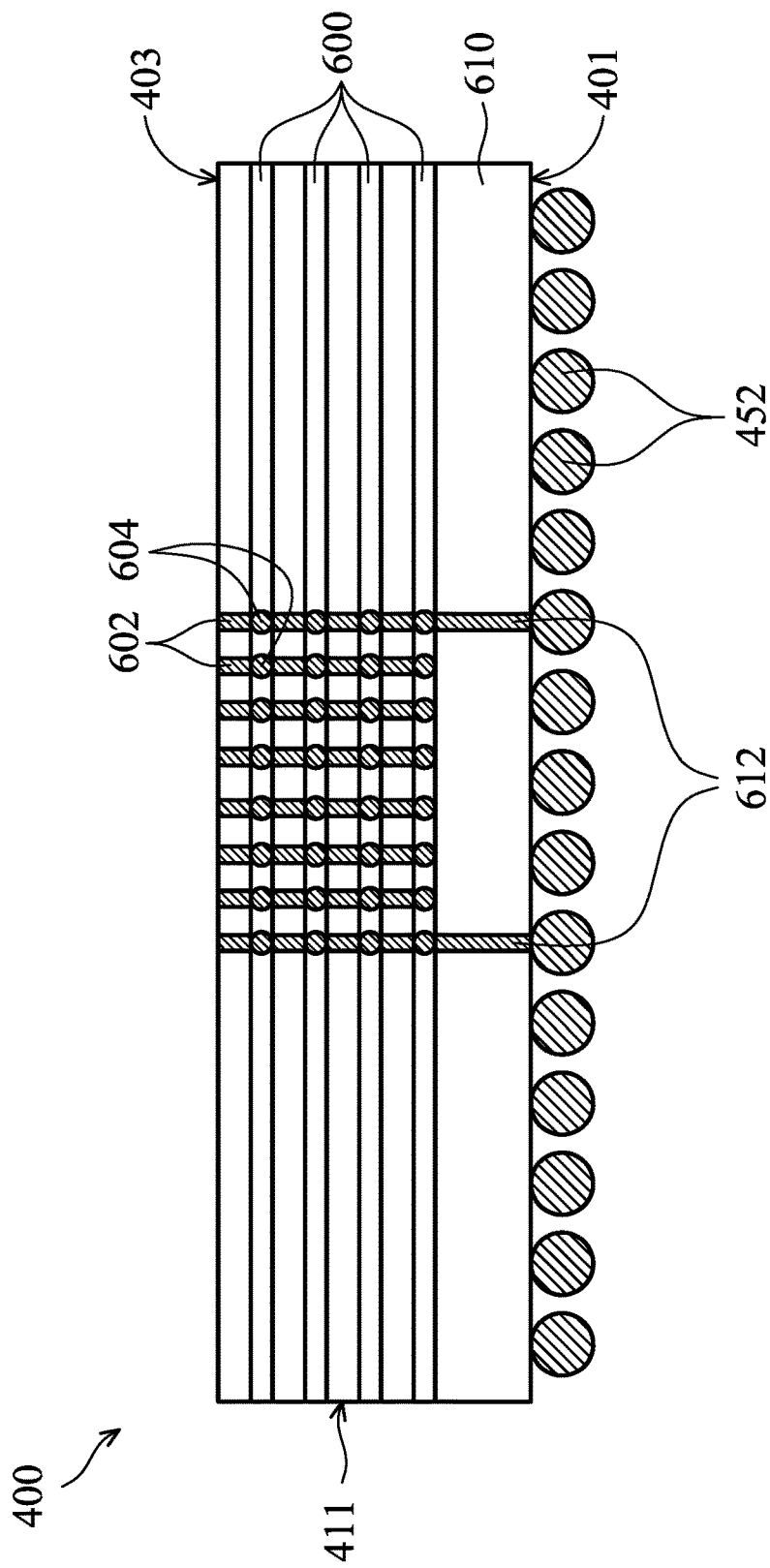
FIG. 1D is an enlarge view of a high bandwidth memory (HBM) package of a semiconductor package assembly shown in FIGS. 1B and 1C.

FIG. 1C is a cross-sectional view taken along line A-A' of FIG. 1A showing a semiconductor package assembly 500B in accordance with some embodiments of the disclosure. Elements of the embodiments hereinafter, that are the same or similar as those previously described with reference to FIGS. 1A and 1B, are not repeated for brevity. The differences between the semiconductor package assembly 500B and the semiconductor package assembly 500A is that the semiconductor package assembly 500B includes a heat sink structure 700B. In some embodiments, the heat sink structure 700B is a one-piece structure (all-in-one structure). For example, the heat sink structure 700B may have an inverted U-shape in the cross-sectional view, as shown in FIG. 1C. A bottom surface 721 of the heat sink structure 700B is connected to a portion of the package-attached surface 202 of the base 200 that is not covered by the SOC package 300A and the HBM packages 400 through the thermal interface material 704. The heat sink structure 700B and the base 200 collectively form a space 720B that accommodates the SOC package 300A and the HBM packages 400. In addition, an inner surface 722B of the heat sink structure 700B may be connected to the back surface 303 of the SOC package 300A through the thermal interface material 704. In addition, a boundary 711B of the heat sink structure 700B may be aligned with the boundary 211 of the base 200, as shown in FIG. 1C. In addition, an inner surface 722 of the heat sink structure 700B may be connected to the SOC package 300A through the thermal interface material 704 to facilitate the dissipation of heat generated by the SOC package 300A and the HBM packages 400.

In some embodiments, the HBM packages 400 of the semiconductor package assembly (e.g. the semiconductor package assemblies 500A and 500B) are positioned directly under a portion of the logic die 302 of the SOC package 300A. The HBM packages 400 may be positioned between the gap between the SOC package 300A and the base 200. In addition, the HBM packages 400 may be positioned embedded a portion of the base 200 or passing through the base 200 in order to reduce the height of the semiconductor package assembly. In some embodiments, the memory dies 600 in the same HBM package 400 and the logic die 302 of the SOC package 300A are positioned overlapping with each other and respectively connect the bump-attach surface 315 and the die-attached surface 313 of the RDL structure 316. Therefore, the transmission path between the SOC package 300A and the HBM packages 400 along a direction that is substantially parallel to the die-attached surface 313 (or the bump-attach surface 315) of the RDL structure 316, may be further reduced. The semiconductor package assembly 500A (or 500B) may have low impedance in the network applications.

In some embodiments, the semiconductor package assembly (e.g. the semiconductor package assemblies 500A and 500B) includes a heat sink structure (e.g. the heat sink structures 700A and 700B) overlying the SOC package 300A and the HBM packages 400 and connected to the base 200 to form a space (e.g. spaces 702A and 702B) for accommodating the SOC package 300A and the HBM packages 400. For example, the heat sink structure 700A may be composed of a ring portion 702 and a cover portion 706. For example, the heat sink structure 700B may be a one-piece structure. In addition, the heat sink structure may be connected to the SOC package 300A through the thermal interface material 704, which may help to dissipate heat generated by the SOC package 300A and the HBM packages 400.

Figure 2A:
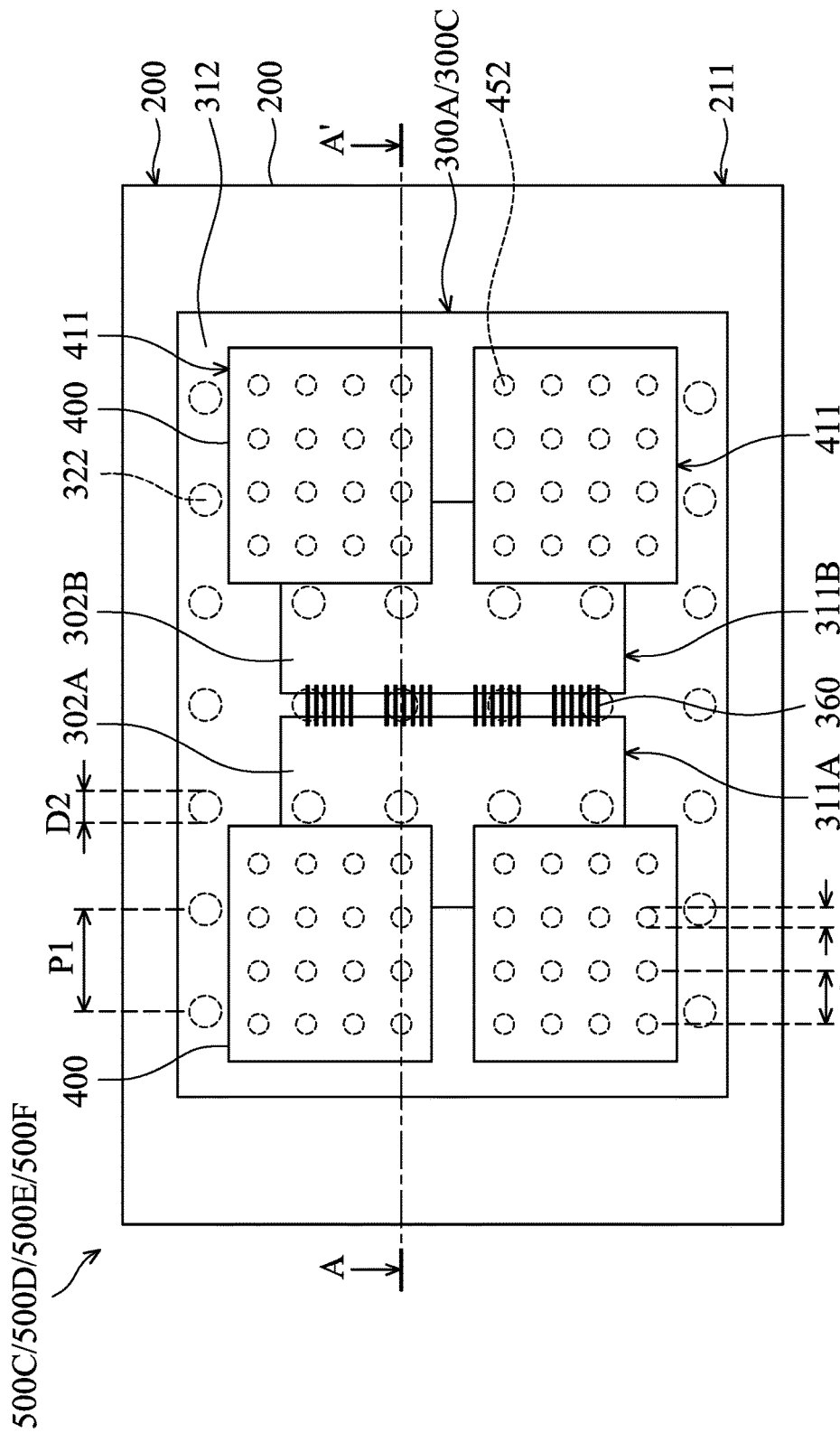
FIG. 2A is a plan view of a semiconductor package assembly including a system-on-chip (SOC) package and high bandwidth memory (HBM) packages stacked thereon in accordance with some embodiments of the disclosure.
Figure 2B:
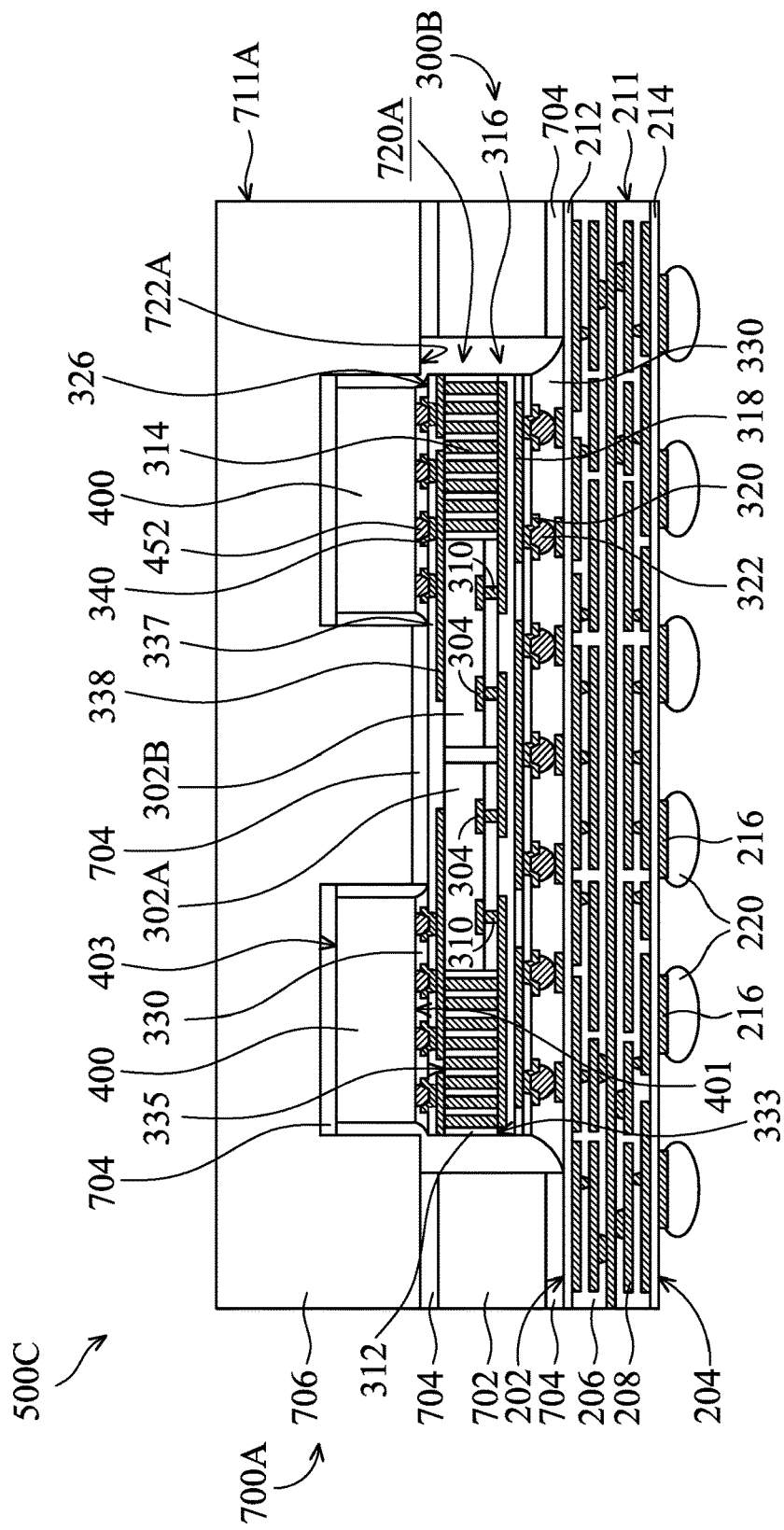
FIGS. 2B-2E are cross-sectional views taken along line A-A' of FIG. 2A showing semiconductor package assemblies in accordance with some embodiments of the disclosure.

FIG. 2A is a plan view of a semiconductor package assembly 500C (or 500D, 500E, 500F) including a SOC package 300B (or 300C) and four HBM packages 400 stacked thereon in accordance with some embodiments of the disclosure. FIG. 2A also shows the arrangements of the SOC package, the HBM package and the base. In FIG. 2A, the heat sink structure is omitted. FIG. 2B is a cross-sectional view taken along line A-A' of FIG. 2A showing the semiconductor package assembly 500C in accordance with some embodiments of the disclosure. Elements of the embodiments hereinafter, that are the same or similar as those previously described with reference to FIGS. 1A-1D, are not repeated for brevity.

In some embodiments, as shown in FIGS. 2A and 2B, the difference between the semiconductor package assembly 500C and the semiconductor package assembly 500A (FIGS. 1A-1B) is that the semiconductor package assembly 500C includes the SOC package 300B. In some embodiments, the SOC package 300B includes a first logic die 302A and a second logic die 302B positioned next to the first logic die 302A. The first logic die 302A and the second logic die 302B may be electrically coupled to each other by conductive traces 360. In addition, the first logic die 302A and the second logic die 302B may be electrically coupled to the RDL structure 316. For example, the logic die 302 (FIGS. 1A-1C) may be partitioned into the first logic die 302A and the second logic die 302B according to the functions to increase the fabrication yield of the individual logic dies. In some embodiments, four HBM packages 400 vertically stacked on each of the first logic die 302A and the second logic die 302B of the SOC package 300B, as shown in FIGS. 2A and 2B. It should be noted that the number of the HBM packages 400 integrated in the semiconductor package assembly 500C (or 500D, 500E, 500F) is not limited to the disclosed embodiment.

In some embodiments, as shown in FIGS. 2A and 2B, the SOC package 300B further includes a redistribution layer (RDL) structure 326 positioned over the molding compound 312 and separated from the RDL structure 316 through the molding compound 312. In addition, the RDL structure 316 and the RDL structure 326 are respectively in contact with opposite surfaces 333 and 335 of the molding compound 312 of the SOC package 300B. In some embodiments, the RDL structure 326 includes conductive traces 338, inter-metal dielectric (IMD) layers 337 and RDL contact pads 340. In addition, the conductive traces 360 (FIG. 2A), which is electrically connected to the first logic die 302A and the second logic die 302B, may be positioned in the RDL structure 326.

In some embodiments, as shown in FIGS. 2A and 2B, the SOC package 300B further includes vias 314 passing through the molding compound 312. Therefore, the vias 314 may serve as through package vias (TPV)s. The vias 314 may be arranged to surround the first logic die 302A and the second logic die 302B of the SOC package 300B. In addition, each of the vias 314 may have two terminals respectively in contact with and electrically coupled to the RDL structure 316 and the RDL structure 326.

In some embodiments, as shown in FIGS. 2A and 2B, the first logic die 302A and the second logic die 302B and the HBM packages 400 are positioned overlying the die-attached surface 313 of the RDL structure 316. The HBM packages 400 may be spaced apart from the conductive structures 322 of the SOC package 300B through the RDL structure 316, the vias 314 and the RDL structure 326. In addition, the RDL structure 316 may be positioned between the conductive structures 322 of the SOC package 300B and the vias 314. The RDL structure 326 may be positioned between the HBM packages 400 and the vias 314. Therefore, the pads 304 of the first logic die 302A and the second logic die 302B of the SOC package 300B may face toward the base 200. In addition, the conductive structures 452 of the HBM packages 400 and the molding compound 312 are respectively in contact with opposite surfaces of the RDL structure 326. Therefore, the HBM packages 400 may be electrically coupled to the RDL structure 316 by the RDL structure 326 and the vias 314.

In some embodiments, as shown in FIG. 2B, the ring portion 702 of the heat sink structure 700A may surround the SOC package 300B. In addition, the cover portion 706 of the heat sink structure 700A may cover the SOC package 300B and the HBM packages 400. An inner surface 722A of the cover portion 706 of the heat sink structure 700A may be connected to the SOC package 300B and the HBM packages 400 through the thermal interface material 704. Therefore, heat generated by the SOC package 300B and the HBM packages 400 may dissipate to the heat sink structure 700A more easily.

Figure 2C:
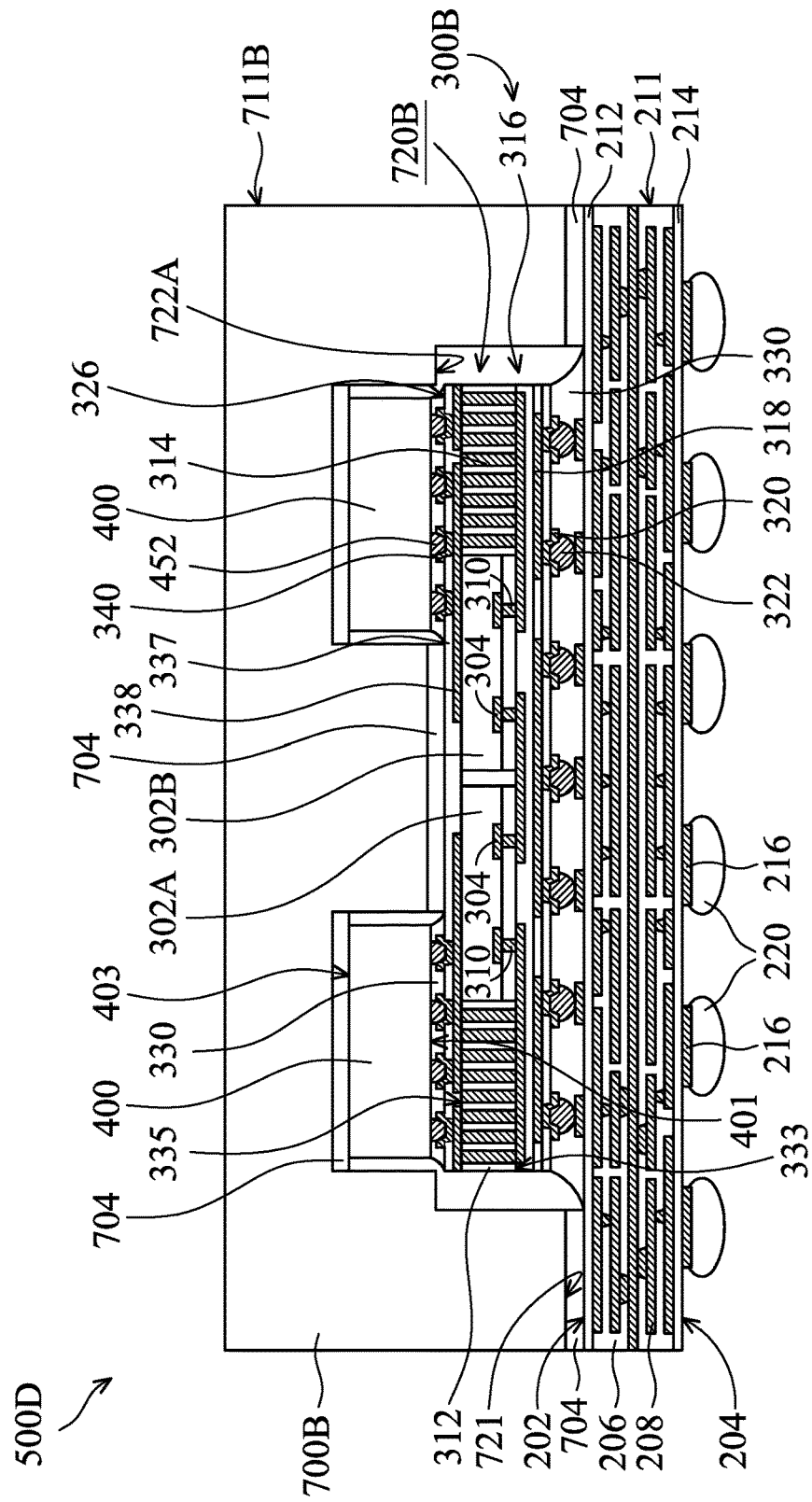

FIG. 2C is a cross-sectional view taken along line A-A' of FIG. 2A showing a semiconductor package assembly 500D in accordance with some embodiments of the disclosure. Elements of the embodiments hereinafter, that are the same or similar as those previously described with reference to FIGS. 1A-1C, 2A and 2B, are not repeated for brevity. The differences between the semiconductor package assembly 500D and the semiconductor package assembly 500C is that the semiconductor package assembly 500D includes the one-piece heat sink structure 700B. The inner surface 722B of the heat sink structure 700B may be connected to the SOC package 300B and the HBM packages 400 through the thermal interface material 704. In addition, the arrangements of the heat sink structure 700B, that are the same or similar as those previously described with reference to FIG. 1C, are not repeated for brevity.

Figure 2D:
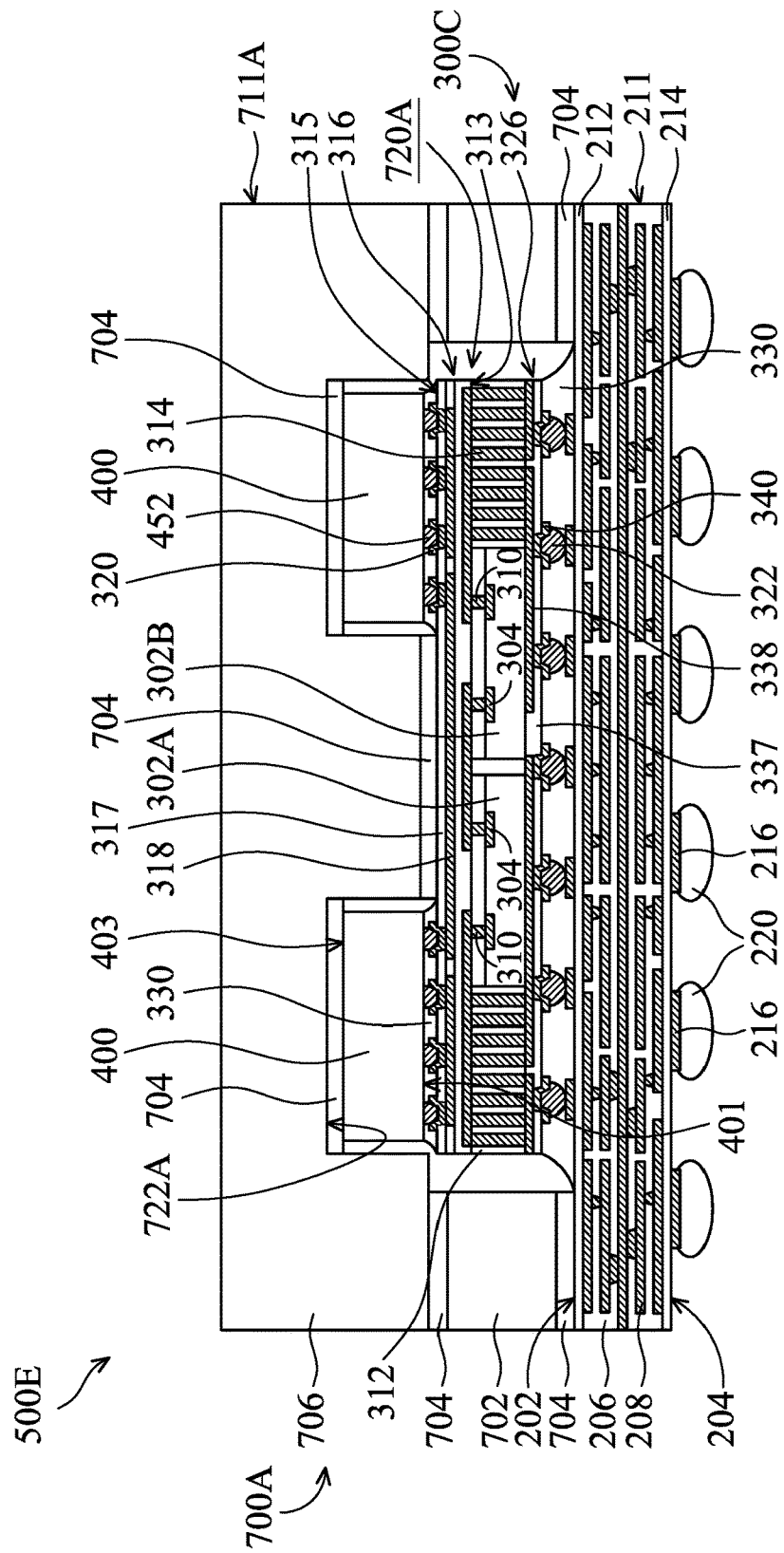

FIG. 2D is a cross-sectional view taken along line A-A' of FIG. 2A showing the semiconductor package assembly 500E in accordance with some embodiments of the disclosure. Elements of the embodiments hereinafter, that are the same or similar as those previously described with reference to FIGS. 1A-1C and 2A-2C, are not repeated for brevity.

In some embodiments, as shown in FIGS. 2A and 2D, the differences between the semiconductor package assembly 500E and the semiconductor package assembly 500C (FIGS. 2A-2B) is that the RDL structure 326 of the semiconductor package assembly 500E include a SOC package 300C. In the SOC package 300C, the RDL structure 326 may be positioned between the conductive structures 322 and the vias 314, and the RDL structure 316 may be positioned between the HBM packages 400 and the vias 314. Therefore, the first logic die 302A and the second logic die 302B may be positioned overlying the die-attached surface 313 of the RDL structure 316, and the HBM packages 400 (and the conductive structures 452) are may be positioned overlying the bump-attached surface 315 of the RDL structure 316. Because the HBM packages 400 are positioned overlying the SOC package 300C and separated from the base through the SOC package 300C. The pads 304 of the first logic die 302A and the second logic die 302B of the SOC package 300C may face away from the base 200. In addition, the conductive structures 322 of the SOC package 300C may be positioned on die-attached surface 313 of the RDL structure 316. Therefore, the conductive structures 322 of the SOC package 300C may be electrically coupled to the first RDL structure through first vias passing through the molding compound of the first semiconductor package.

In some embodiments, as shown in FIG. 2D, the ring portion 702 of the heat sink structure 700A may surround the SOC package 300C. In addition, the cover portion 706 of the heat sink structure 700A may cover the SOC package 300C and the HBM packages 400. An inner surface 722A of the cover portion 706 of the heat sink structure 700A may be connected to the SOC package 300C and the HBM packages 400 through the thermal interface material 704. Therefore, heat generated by the SOC package 300C and the HBM packages 400 may dissipate to the heat sink structure 700A more easily.

Figure 2E:
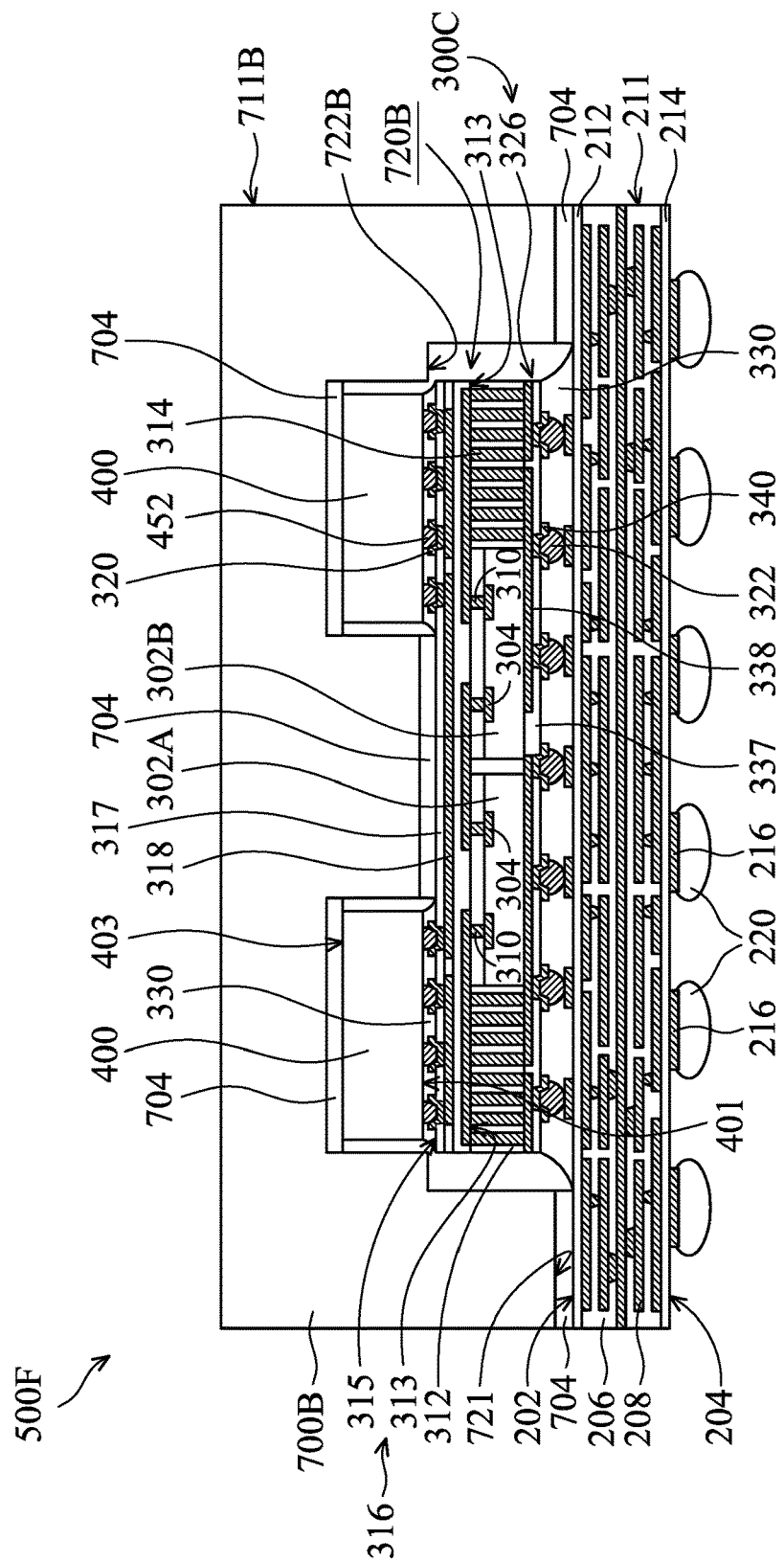

FIG. 2E is a cross-sectional view taken along line A-A' of FIG. 2A showing a semiconductor package assembly 500F in accordance with some embodiments of the disclosure. Elements of the embodiments hereinafter, that are the same or similar as those previously described with reference to FIGS. 1A-1C and 2A-2D, are not repeated for brevity. The differences between the semiconductor package assembly 500F and the semiconductor package assembly 500E is that the semiconductor package assembly 500F includes the one-piece heat sink structure 700B. The inner surface 722B of the heat sink structure 700B may be connected to the SOC package 300C and the HBM packages 400 through the thermal interface material 704. In addition, arrangements of the heat sink structure 700B, that are the same or similar as those previously described with reference to FIGS. 1C and 2C, are not repeated for brevity.

As described previously, the SOC package (e.g. the SOC packages 300B and 300C) of the semiconductor package assembly (e.g. the semiconductor package assemblies 500C-500F) may include two RDL structures (e.g. the RDL structures 316 and 326) respectively on opposite surfaces of the molding compound 312. Therefore, the conductive structures 452 of the HBM packages 400 and the conductive structures 322 of the SOC package may be in contact with the different RDL structures 316 and 326. In addition, the pads 304 of the logic dies (e.g. the first logic die 302A and the second logic die 302B) of the SOC package may face toward or face away from the base 200 to increase the design flexibility.

Embodiments provide the semiconductor package assemblies 500A-500F. The semiconductor package assemblies 500A-500F may provide a plurality of high bandwidth memory (HBM) packages (e.g. the high bandwidth HBM packages 400) stacked on a SOC package (e.g. the SOC packages 300A-300C). The HBM packages may be composed of three-dimensional (3D) stacked memory dies with through silicon via (TSV) interconnects formed passing therethrough. In some embodiments, the HBM packages may be mounted on the bump-attached surface of the RDL structure of the SOC package and embedded in the base. The lateral transmission path (substantially parallel to the die-attached surface (or the bump-attach surface) of the RDL structure) between the SOC package and the HBM packages may be further reduced. In some embodiments, the SOC package of the semiconductor package assembly may include two RDL structures respectively on opposite surfaces of the molding compound to facilitate the bonding of the HBM packages thereon and electrically connecting to the logic die by through package vias (TPV) (for example, the vias 314) passing through the molding compound. Therefore, the semiconductor package assemblies 500A-500F may satisfy the requirements of low impedance, high bandwidth and quick transition in the network applications.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
   a first semiconductor package, comprising:
   a first redistribution layer (RDL) structure having a first surface and a second surface opposite to the first surface;
   a first semiconductor die disposed on the first surface of the first RDL structure and electrically coupled to the first RDL structure; and
   a molding compound overlying the first semiconductor die and the first surface of the first RDL structure; and
   a second semiconductor package overlying a portion of the first semiconductor package, comprising:
   a first memory die; and
   a second memory die vertically stacked on the first memory die, wherein the second memory die is electrically coupled to first memory die by through silicon via (TSV) interconnects formed passing through the second memory die,
   wherein a boundary of the second semiconductor package is surrounded by a boundary of the molding compound of the first semiconductor package from a plan view.

2. The semiconductor package assembly as claimed in claim 1, wherein the first semiconductor package comprises first conductive structures electrically coupled to the first RDL structure, and the second semiconductor package comprises second conductive structures electrically coupled to the first RDL structure.

3. The semiconductor package assembly as claimed in claim 2, wherein each of the first conductive structures of the first semiconductor package has a first diameter, each of the second conductive structures of the second semiconductor package has a second diameter that is less than the first diameter.

4. The semiconductor package assembly as claimed in claim 2, wherein the first conductive structures of the first semiconductor package are periodically arranged with a first pitch, and the second conductive structures of the second semiconductor package are arranged with a second pitch that is less than the first pitch.

5. The semiconductor package assembly as claimed in claim 2, further comprising:
   a base, wherein the first semiconductor package and the second semiconductor package are mounted on the base through the first conductive structures of the first semiconductor package.

6. The semiconductor package assembly as claimed in claim 5, wherein the second semiconductor package embedded in the base, the first conductive structures of the first semiconductor package and the second conductive structures of the second semiconductor package are in contact with the second surface of the first RDL structure.

7. The semiconductor package assembly as claimed in claim 5, further comprising:
   a heat sink structure overlying the first semiconductor package and the second semiconductor package, wherein the heat sink structure is connected to the base to form a space for accommodating the first semiconductor package and the second semiconductor package.

8. The semiconductor package assembly as claimed in claim 7, wherein the heat sink structure comprises;
   a ring portion connected to the base and surrounding the first semiconductor package and the second semiconductor package; and
   a cover portion covering the first semiconductor package and the second semiconductor package and connected to the ring portion.

9. The semiconductor package assembly as claimed in claim 2, wherein the second semiconductor package is coupled to the first RDL structure by first vias passing through the molding compound of the first semiconductor package.

10. The semiconductor package assembly as claimed in claim 9, wherein the first semiconductor package comprises:
    a second redistribution layer (RDL) structure over the molding compound and separated from the first RDL structure through the molding compound, wherein the first vias are electrically coupled to the second RDL structure.

11. The semiconductor package assembly as claimed in claim 10, wherein pads of the first semiconductor die are electrically coupled to the first RDL structure through second vias between the first semiconductor die and the first surface of the first RDL structure.

12. The semiconductor package assembly as claimed in claim 10, wherein the second semiconductor package comprises second conductive structures, wherein the second conductive structures and the molding compound are respectively in contact with opposite surfaces of the second RDL structure.

13. The semiconductor package assembly as claimed in claim 1, wherein the first semiconductor package comprises:
    a second semiconductor die next to the first semiconductor die and electrically coupled to the RDL structure.

14. A semiconductor package assembly, comprising:
    a first semiconductor package, comprising:
    a first redistribution layer (RDL) structure having a first surface and a second surface opposite to the first surface;
    a logic die electrically coupled to the first RDL structure; and
    a molding compound overlying the logic die and the first surface of the first RDL structure; and
    a second semiconductor package stacked on the first semiconductor package, comprising:

a plurality of memory dies stacked one on top of the other, wherein each of the plurality of memory dies has through silicon via (TSV) interconnects, wherein a boundary of the second semiconductor package is surrounded by a boundary of the molding compound of the first semiconductor package from a plan view.

15. The semiconductor package assembly as claimed in claim 14, wherein the first semiconductor package comprises:

first conductive structures electrically coupled to the first RDL structure, wherein the first conductive structures are spaced apart from the logic die through the first RDL structure.

16. The semiconductor package assembly as claimed in claim 15, further comprising:

a base electrically coupled to the first semiconductor package and the second semiconductor package, wherein a boundary of the base surrounds the boundary of the molding compound of the first semiconductor package and the boundary of the second semiconductor package from the plan view.

17. The semiconductor package assembly as claimed in claim 16, wherein the logic die having pads positioned between a front side of the logic die and the first surface of the first RDL structure.

18. The semiconductor package assembly as claimed in claim 16, wherein the second semiconductor package is positioned between the second surface of the first RDL structure of the first semiconductor package and the base.

19. The semiconductor package assembly as claimed in claim 16, wherein the first semiconductor package comprises:

a second redistribution layer (RDL) structure over the molding compound, wherein the first RDL structure and the second RDL structure are in contact with opposite surfaces of the molding compound of the first semiconductor package; and first vias passing through the molding compound of the first semiconductor package, wherein the first vias are electrically coupled to the first RDL structure and the second RDL structure.

20. The semiconductor package assembly as claimed in claim 19, wherein the second semiconductor package and the first vias are positioned overlying opposite surfaces of the second RDL structure.

21. The semiconductor package assembly as claimed in claim 20, wherein the first conductive structures are positioned on the first surface of the first RDL structure and electrically coupled to the first RDL structure through first vias passing through the molding compound of the first semiconductor package.

22. The semiconductor package assembly as claimed in claim 19, wherein the second semiconductor package is spaced apart from the first conductive structures through the first RDL structure, the first vias and the second RDL structure.

23. The semiconductor package assembly as claimed in claim 22, wherein the logic die and the second semiconductor package are positioned overlying the first surface and the second surface of the first RDL structure, respectively.

24. The semiconductor package assembly as claimed in claim 16, further comprising:

a heat sink structure overlying the first semiconductor package and the second semiconductor package, wherein the heat sink structure is connected to the base to form a space for accommodating the first semiconductor package and the second semiconductor package.

25. A semiconductor package assembly, comprising:
a system-on-chip (SOC) package, comprising:
a first redistribution layer (RDL) structure;
a logic die electrically coupled to the first RDL structure; and
a molding compound overlying the logic die and the first RDL structure; and
a memory package stacked on the SOC package, comprising:
a plurality of memory dies stacked one on top of the other, wherein each of the plurality of memory dies has through silicon via (TSV) interconnects rather than RDL structures,
wherein the memory package is positioned overlying a portion of the molding compound of the SOC package,
wherein a boundary of the memory package is surrounded by a boundary of the molding compound from a plan view.

26. The semiconductor package assembly as claimed in claim 25, wherein the SOC package comprises:
first conductive structures electrically coupled to the first RDL structure; and
a base in contact with the first conductive structures and electrically coupled to the first semiconductor package and the second semiconductor package, and wherein the memory package is embedded in the base and surrounded by the first conductive structures of the SOC package.

* * * * *